United States Patent
Yen et al.

(10) Patent No.: US 9,368,650 B1
(45) Date of Patent: Jun. 14, 2016

(54) SIC JUNCTION BARRIER CONTROLLED SCHOTTKY RECTIFIER

(71) Applicant: Hestia Power Inc., Hsinchu (TW)

(72) Inventors: Cheng-Tyng Yen, Hsinchu (TW);
Chien-Chung Hung, Hsinchu (TW);
Chwan-Ying Lee, Hsinchu (TW);
Lurng-Shehng Lee, Hsinchu (TW)

(73) Assignee: HESTIA POWER INC., Hsinchu (TW)

( * ) Notice: Subject to any disclaimer, the term of this patent is extended or adjusted under 35 U.S.C. 154(b) by 0 days.

(21) Appl. No.: 14/801,123

(22) Filed: Jul. 16, 2015

(51) Int. Cl.
*H01L 29/872* (2006.01)
*H01L 29/45* (2006.01)
*H01L 29/47* (2006.01)
*H01L 29/16* (2006.01)

(52) U.S. Cl.
CPC .......... *H01L 29/872* (2013.01); *H01L 29/1608* (2013.01); *H01L 29/45* (2013.01); *H01L 29/47* (2013.01)

(58) Field of Classification Search
CPC ................... H01L 2924/12032; H01L 29/872; H01L 2924/13034; H01L 29/1608; H01L 29/0619; H01L 29/7806; H01L 29/66143; H01L 29/66212
See application file for complete search history.

(56) References Cited

U.S. PATENT DOCUMENTS

| | | | | |
|---|---|---|---|---|
| 7,737,523 B2* | 6/2010 | Kikuchi | ............... | H01L 29/872 257/484 |
| 8,680,587 B2* | 3/2014 | Henning | ............. | H01L 29/8611 257/155 |
| 8,723,218 B2* | 5/2014 | Hobart | ................ | H01L 29/6606 257/119 |
| 8,901,699 B2* | 12/2014 | Ryu | ....................... | H01L 29/872 257/472 |
| 8,952,481 B2* | 2/2015 | Zhang | ................. | H01L 29/6606 257/471 |
| 9,006,746 B2* | 4/2015 | Jung | ................... | H01L 29/0619 257/109 |
| 9,178,079 B2* | 11/2015 | Kono | .................... | H01L 29/872 |
| 2006/0022292 A1 | 2/2006 | Shenoy | | |

* cited by examiner

*Primary Examiner* — Mohsen Ahmadi
(74) *Attorney, Agent, or Firm* — Muncy, Geissler, Olds & Lowe, P.C.

(57) ABSTRACT

A SiC junction barrier controlled Schottky rectifier includes a SiC substrate, a n-type drift layer, a p-type doping region, a plurality of junction field-effect regions, a first metal layer and a second metal layer. The drift layer is disposed on the SiC substrate. The junction field-effect regions are disposed in the drift layer and are surrounded by the p-type doping region. The first metal layer is disposed on the drift layer. The second metal layer is disposed at one side of the SiC substrate away from the drift layer. Through N circular regions and (N−1) inter-circle regions each connecting two of the circular regions, as well as geometric characteristics of the circular regions and the inter-circle regions, a leakage current of devices is effectively reduced and ruggedness is increased to improve an issue of a large leakage current of a conventional Schottky barrier diode.

11 Claims, 10 Drawing Sheets

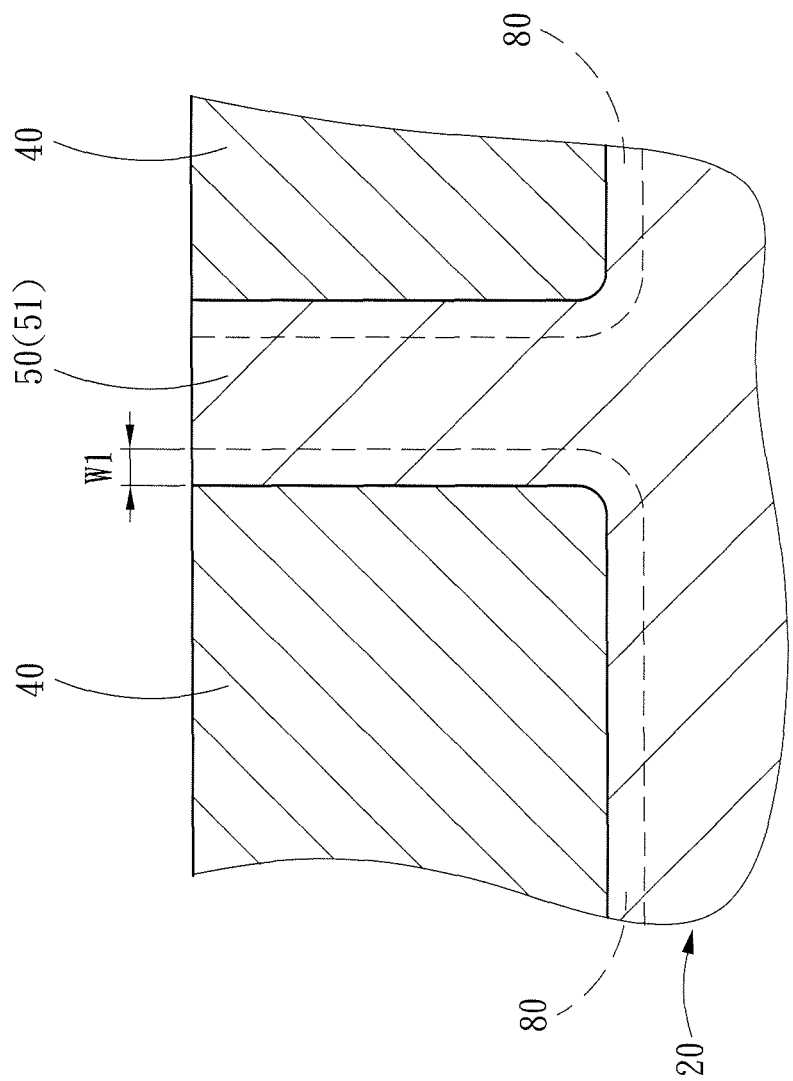

SIC JUNCTION BARRIER CONTROLLED SCHOTTKY RECTIFIER

FIELD OF THE INVENTION

The present invention relates to a semiconductor device, and particularly to a SiC Schottky rectifier.

BACKGROUND OF THE INVENTION

SiC features a wide bandgap, and excellent chemical stability, electrical conductivity and heat conductivity. Power devices are extensively employed in various alternating-current to direct-current (AC/DC) conversion applications, and demand characteristics of low turn-on resistance, low leakage current, high breakdown voltage and fast switching in order to reduce turn-on loss and switching loss generated during operations. As SiC offers a high critical electric field of dielectric breakdown due to its wide bandgap, as well as an intrinsic carrier concentration far lower than doping concentrations in the devices, SiC power devices are suitable for high temperature, high frequency and high power applications.

For example, the U.S. Patent Publication No. US2006/0022292 discloses a structure, "Schottky Barrier Diode" (SBD). The structure features a substrate and two or more epitaxial layers. The epitaxial layers include at least a lightly doped n-type epitaxial layer, and another lightly doped n-type epitaxial layer having an even smaller doping concentration. Thus, by optimizing the thicknesses and doping concentrations of the two epitaxial layers, the capacitance and the switching loss of the SiC Schottky barrier diode is reduced, while maintaining a lower forward voltage drop and a lower turn-on resistance in the meantime.

The forward voltage drop of the Schottky barrier diode is mainly determined by the Schottky barrier which is determined by the work function of an anode metal layer and the electron affinity of SiC. A metal having a lower work function is generally selected for a lower Schottky barrier. However, the Schottky barrier would be further lowered due to the image force induced barrier lowering, which will result in a considerable leakage current at a reverse bias.

SUMMARY OF THE INVENTION

It is a primary object of the present invention to reduce the large leakage current incurred when a conventional Schottky barrier diode operates under a reverse bias.

To achieve the above object, the present invention provides a SiC junction barrier controlled Schottky rectifier. The SiC junction barrier controlled Schottky rectifier includes a SiC substrate, a n-type drift layer, a p-type doping region, a plurality of junction field-effect regions, a first metal layer and a second metal layer.

The SiC substrate is n-type and heavily-doped, and includes a first surface and a second surface opposite to the first surface. The n-type drift layer is disposed at the first surface, and includes a third surface away from the first surface. The p-type doping region is disposed in the n-type drift layer and is in contact with the third surface. The junction field-effect regions are disposed in the n-type drift layer, and are surrounded by the p-type doping region to be in contact with the third surface. Each of the junction field-effect regions includes N circular regions and (N−1) inter-circle regions each connecting two of the circular regions, where N is a natural number. The first metal layer is disposed at the third surface, and a Schottky barrier is formed between the first metal layer and the junction field-effect region. The second metal layer is disposed at the second surface, and an Ohmic contact is formed between the second metal layer and the SiC substrate.

As such, in the present invention, the junction field-effect regions are disposed at the n-type drift layer, and the p-type doping region surrounds the junction field-effect regions to form the N circular regions and the (N−1) inter-circle regions between every two of the circular regions. Accordingly, when the SiC junction barrier controlled Schottky rectifier operates under a reverse bias, the junction field-effect regions are capable of effectively reducing the leakage current through the circular regions and the inter-circle regions, thereby improving the issue of a large current of a conventional Schottky barrier diode.

BRIEF DESCRIPTION OF THE DRAWINGS

FIG. 3A is a schematic diagram of a depletion width of the present invention under a 0V bias.

DETAILED DESCRIPTION OF THE PREFERRED EMBODIMENTS

The foregoing, as well as additional objects, features and advantages of the invention will be more readily apparent from the following detailed description, which proceeds with reference to the accompanying drawings.

Figure 1A:
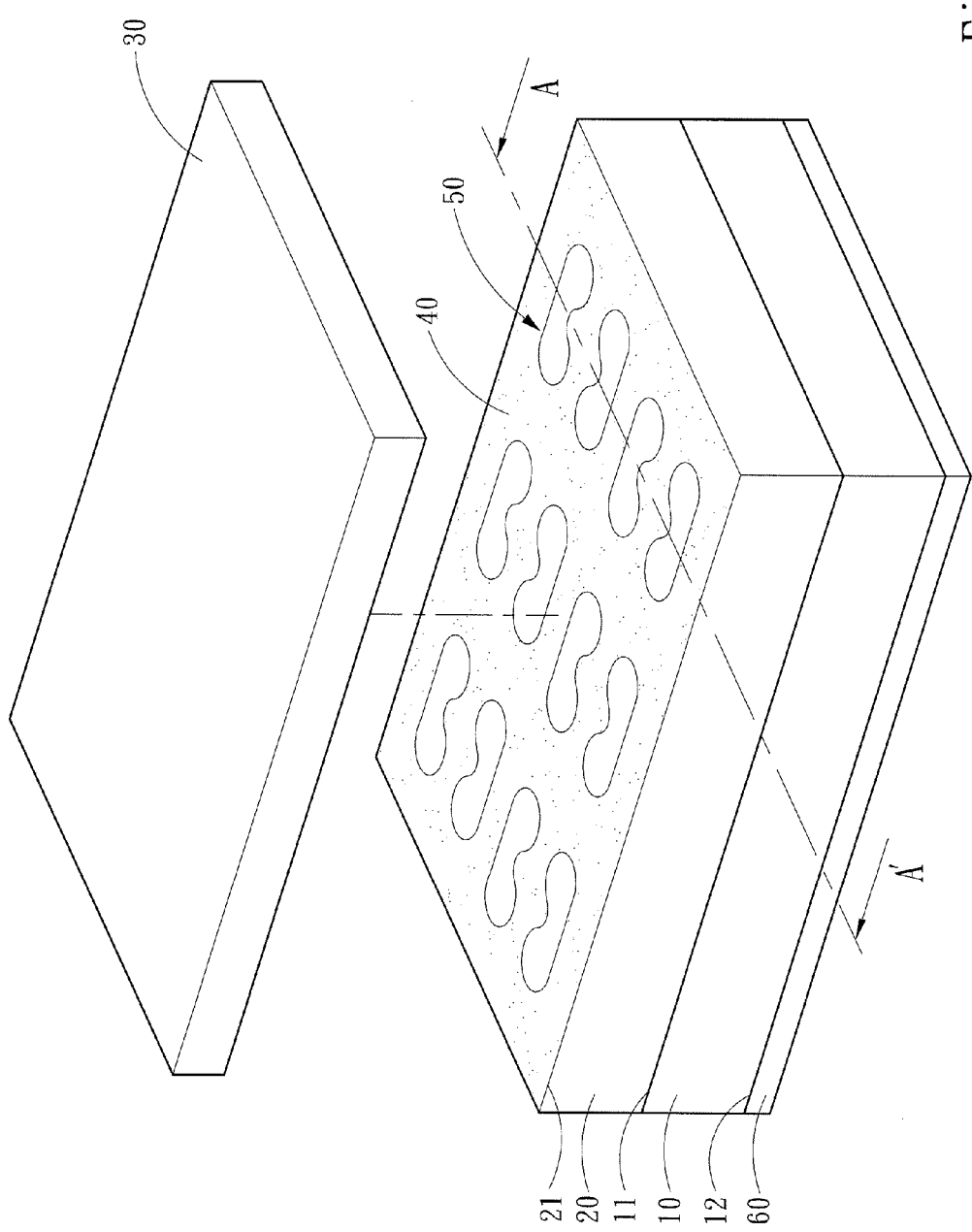
FIG. 1A is an exploded diagram of an appearance according to a first embodiment of the present invention.
Figure 1B:
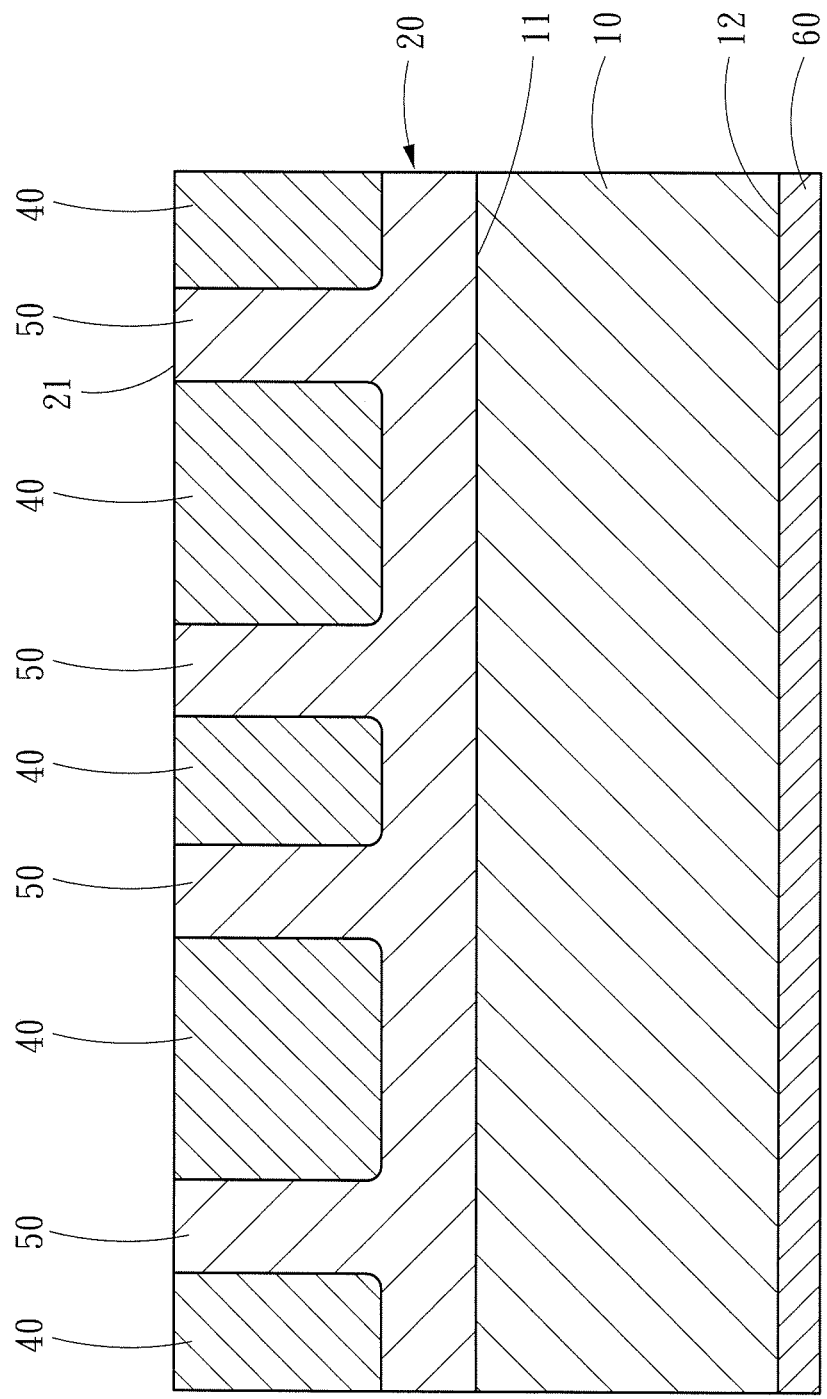
FIG. 1B is a partial section view of FIG. 1A.
Figure 2:
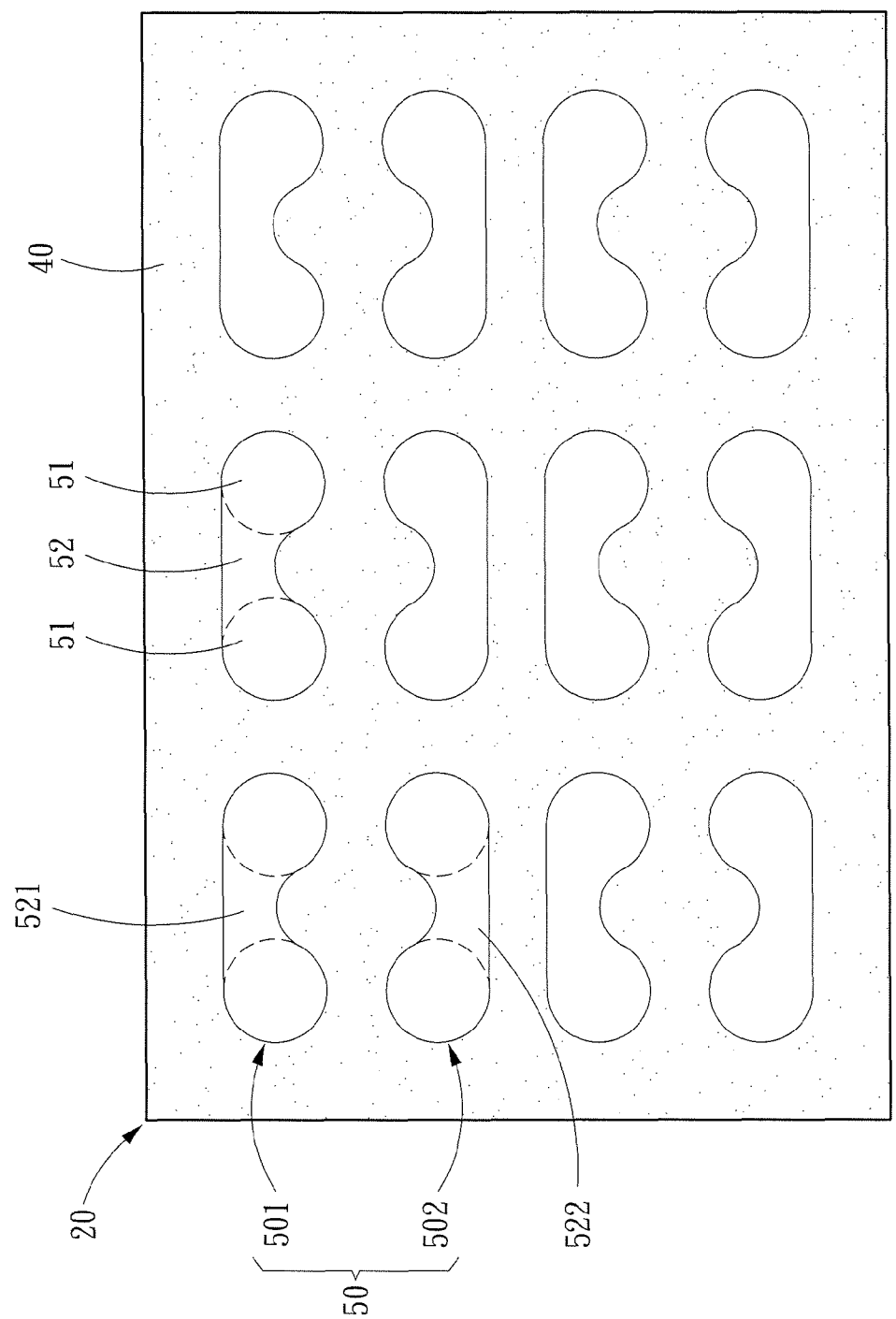
FIG. 2 is a top view of drift layer according to the first embodiment of the present invention.

FIG. 1A shows an exploded diagram of an appearance according to a first embodiment of the present invention. FIG. 1B shows a partial section view of FIG. 1A. FIG. 2 shows a top view of a drift layer according to the first embodiment of the present invention. Referring to FIGS. 1A, 1B and 2, a SiC junction barrier controlled Schottky rectifier includes a SiC substrate 10, a n-type drift layer 20, a p-type doping region 40, a plurality of junction field-effect regions 50, a first metal layer 30 and a second metal layer 60.

The SiC substrate 10 may be obtained by cutting SiC crystals into a predetermined thickness or growing SiC crystals on any substrate, or may be a commercial SiC substrate 10. Given that a substrate having SiC crystals formed on its surface is used, the poly type of SiC substrate 10 is not limited. The SiC substrate 10 is heavily doped n-type, has a resistivity lower than 0.1 Ω·cm, and includes a first surface 11 and a second surface 12 opposite and away from the first surface 11. The n-type drift layer 20 is disposed at the first surface 11, is formed by an epitaxy growth technology in the embodiment, and may be made of a SiC material. Further, the n-type drift layer 20 is n-type with a doping concentration between $1E+14$ cm$^{-3}$ and $1E+17$ cm$^{-3}$, and includes a third surface 21 away from the first surface 11.

The p-type doping region 40 is disposed in the n-type drift layer 20, and may be formed by an ion implantation technology in the embodiment. A dopant of the p-type doping region 40 may be aluminum or boron. Further, a doping concentration of the p-type doping region 40 is greater than that of the n-type drift layer 20, and is between $1E+17$ cm$^{-3}$ and $1E+20$ cm$^{-3}$. The junction field-effect regions 50 are disposed in the n-type drift layer 20, in contact with the third surface 21, and surrounded by the p-type doping region 40 to be spaced from one another. In the embodiment, an ratio of a surface area of the junction field-effect regions 50 to a surface area of the p-type doping region 40 is between 4:6 and 9:1.

The first metal surface 30 is disposed at the third surface 21, and a Schottky barrier is formed between the first metal layer 30 and the junction field-effect regions 50. For example, the first metal layer 30 may be made of a material such as titanium, aluminum, molybdenum, nickel, tantalum, tungsten, and silicides of the above elements.

In the present invention, it should be noted that, the junction field-effect regions 50 are surrounded by the p-type doping region 40 to be spaced from one another, and include N circular regions 51 and (N−1) inter-circle regions. In the embodiment, N is 2, for example. The value is not a limitation of the present invention, and may be a natural number greater than 2 in other embodiments of the present invention. Each of the inter-circle regions 52 connects two of the circular regions 51, and is formed by connecting two circular regions 51 with two arcs. At least one of the arcs is concave. Tangent slopes at connecting positions of the arcs and the two circular regions 51 are equal, such that a width of the inter-circle regions 52 perpendicular to a connecting line between centers of two of the circular regions 51 is smaller than a diameter of the circular regions 51, in a way that the junction field-effect region 50 gradually reduces from the two circular regions 51 towards the inter-circle region 52 to have a smallest width at the inter-circle region 52.

In the present invention, the p-type doping region 40 surrounds the junction field-effect regions 50 to form the circular regions 51 and the inter-circle regions 52 each connecting two of the circular regions 51. Thus, the area of the Schottky contact formed by the junction field-effect regions 50 and the first metal layer 30 may be increased. Further, when the SiC junction barrier controlled Schottky rectifier operates under a reverse bias, an uniform depletion region can still be formed to effectively shield a surface electric field at the Schottky contact to reduce the leakage current.

It should be noted that, in the embodiment, each of the inter-circle region 52 connects between every two of the circular regions 51, such that the junction field-effect regions 50 have an appearance similar to that of a pair of goggles, for example. The above appearance is an example for explaining the present invention, and is mainly targeted at increasing the area of the Schottky contact between every two of the circular regions 51.

Figure 3B:
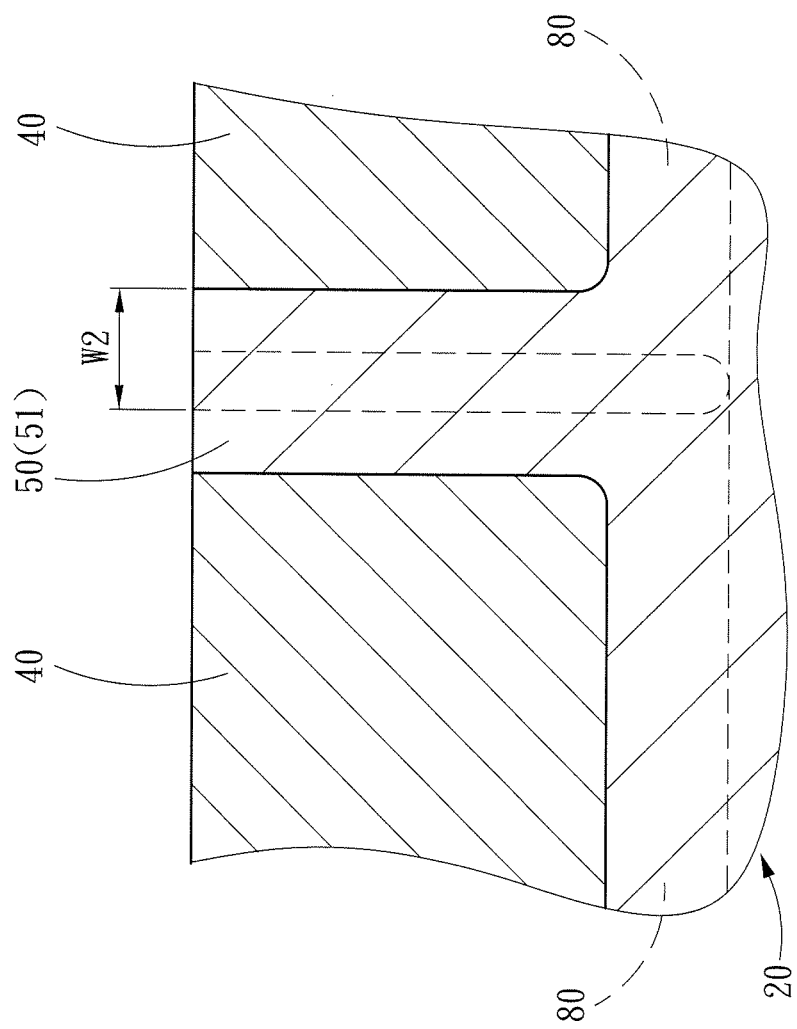
FIG. 3B is a schematic diagram of a depletion width of the present invention under a bias of half of a rated blocking voltage.

FIG. 3A shows a schematic diagram of a depletion width of the present invention under a 0V bias. FIG. 3B shows a schematic diagram of a depletion width of the present invention under a bias of half of a rated blocking voltage. Referring to FIG. 3A and FIG. 3B, as shown in FIG. 3A, in the present invention, the first metal layer 30 performs as an anode and the second cathode layer 60 performs as a cathode. When a 0V bias is applied between the anode and the cathode, a depletion region 80 is formed in the junction field-effect region 50, along the pn junction formed by the p-type doping region 40 and the n-type drift layer 20, and has a depletion width W1. The depletion width W1 is determined by the doping concentration of the n-type drift layer 20 and the concentration of the p-type doping region 40. A radius of the circular regions 50 is greater than the depletion width W1. For another example, as shown in FIG. 3B, when a bias is applied between the anode and the cathode, the pn junction formed between the p-type doping region 40 and the n-type drift layer 20 is under a reverse bias, and the depletion width formed by the pn junction increases as the reverse bias rises. When the reverse bias reaches a half of a rated blocking voltage, the depletion region 80 has another depletion width W2, which is greater than the radius of the circular regions 51.

Figure 4:
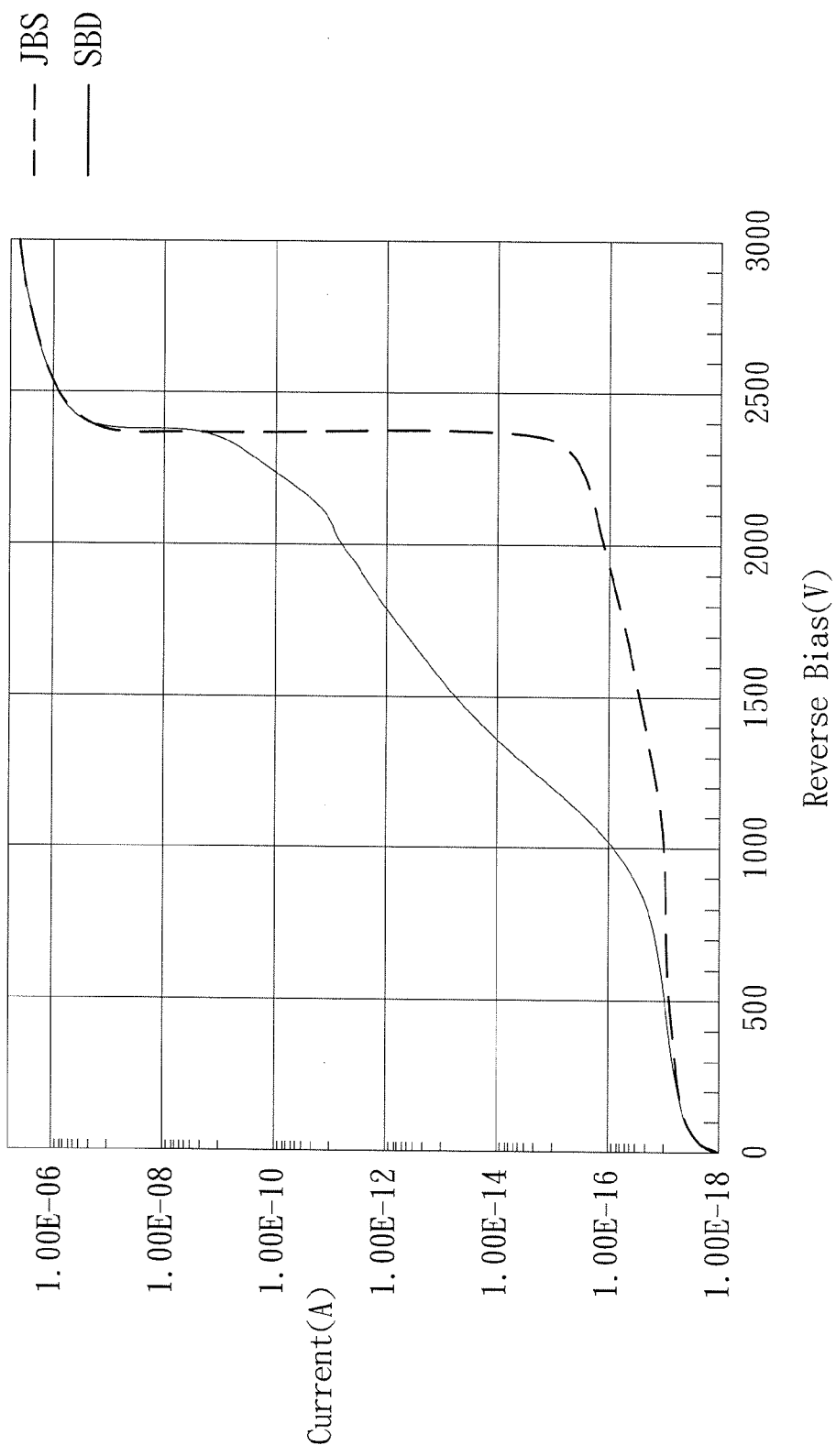
FIG. 4 is a schematic diagram of electrical characteristics of the first embodiment of the present invention and a conventional Schottky barrier diode under a reverse bias.
Figure 5:
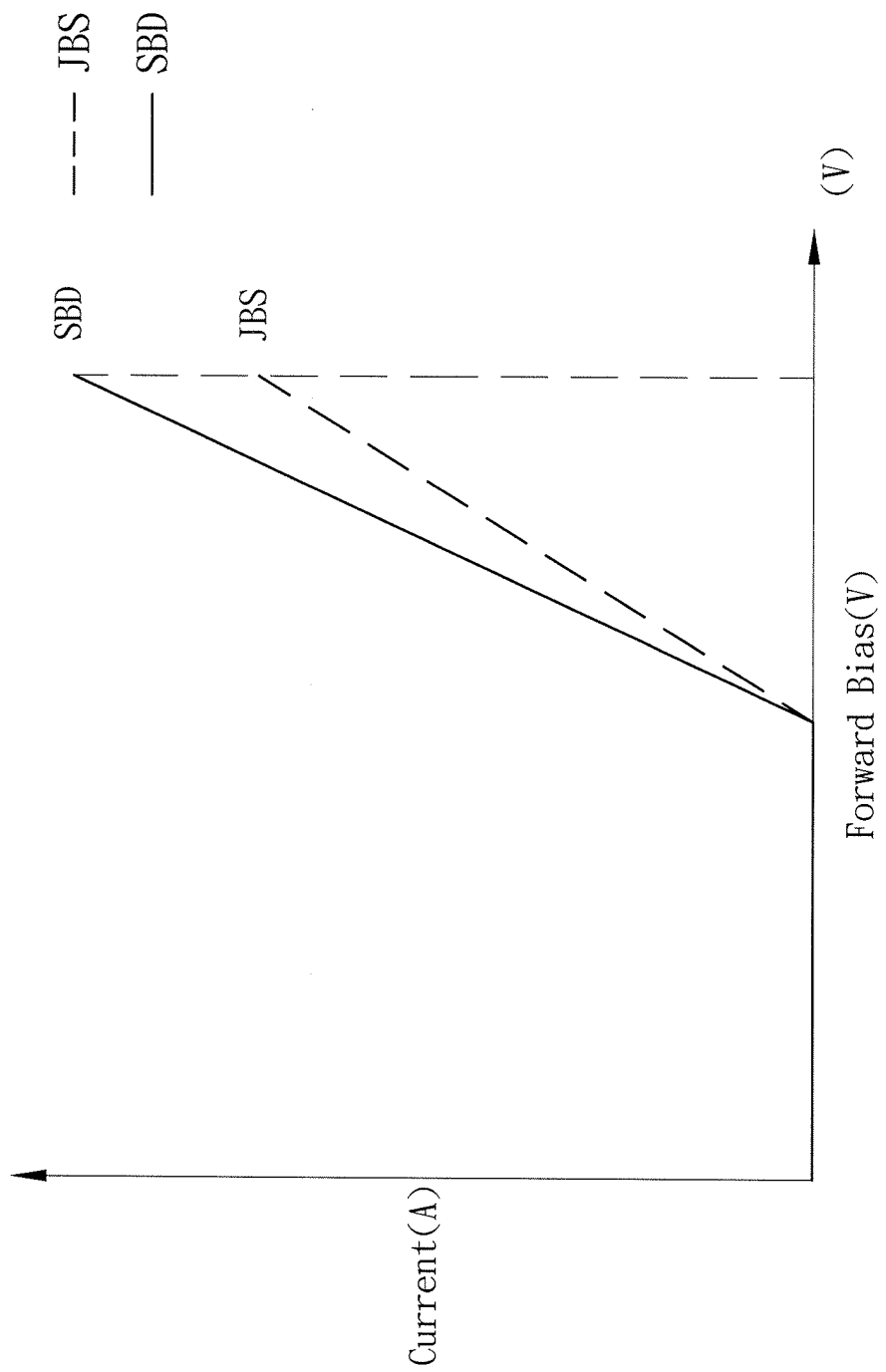
FIG. 5 is a schematic diagram of electrical characteristics of the first embodiment of the present invention and a conventional Schottky barrier diode under a forward bias.

FIG. 4 shows a schematic diagram of simulated device electrical characteristics of the first embodiment of the present invention and a conventional Schottky barrier diode under a reverse bias. In the first embodiment, the n-type drift layer applied has a thickness of 11 μm and a doping concentration of $6E+15$ cm$^{-3}$, and the material of the first metal layer 30 is titanium. The p-type doping region 40 has a doping concentration of $1E+19$ cm$^{-3}$. The depletion region 80 in the absence of a bias (0V) on the n-type drift layer 20 has a width of 0.7 μm, and a target rated blocking voltage is 1200V. Under a 600V reverse bias, which is 50% of the rated blocking voltage, the depletion region 80 has a width of 10.4 μm. In the simulation, the width of the junction field-effect regions 50 is 3 μm. Known from FIG. 4, when the same reverse bias is applied, below the avalanche at about 2300V, the SiC junction barrier controlled Schottky rectifier (JBS) of the present invention, compared to a conventional Schottky barrier diode, has a smaller leakage current, indicating that the junction field-effect regions 50 effectively suppress the leakage current from being produced. FIG. 5 shows a schematic diagram of electrical characteristics of the first embodiment of the present invention and a conventional Schottky barrier diode under a forward bias. Known from FIG. 5, when the same forward bias is applied, the SiC junction barrier Schotty rectifier of the present invention, compared to the conventional Schottky barrier diode, has a smaller forward current due to the effect of the Schottky barrier that is smaller than a built-in potential of the pn junction. Therefore, under a common forward operating voltage (usually smaller than 2V), only the Schottky contact can be conducting, and so a current density of forward conduction is directly proportional to a ratio of the area occupied by the Schottky contact. In other words, by the deposition of the inter-circle regions 52, the ratio of the area occupied by the Schottky contact in the device is increased to further increase the current density of forward conduction.

Figure 6A:
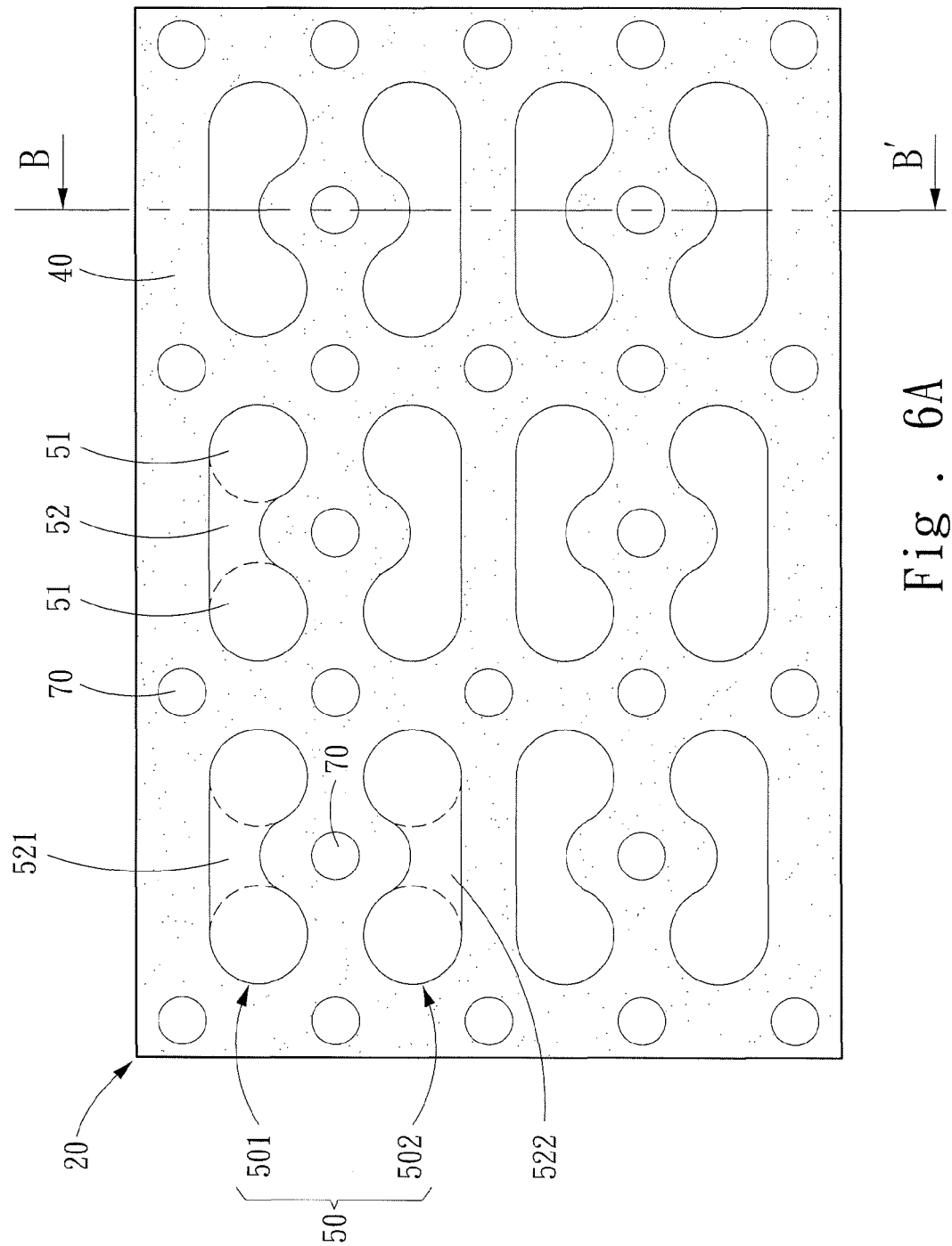
FIG. 6A and FIG. 6B are schematic diagrams of arrangements of a third metal layer according to a second embodiment of the present invention.
Figure 6B:
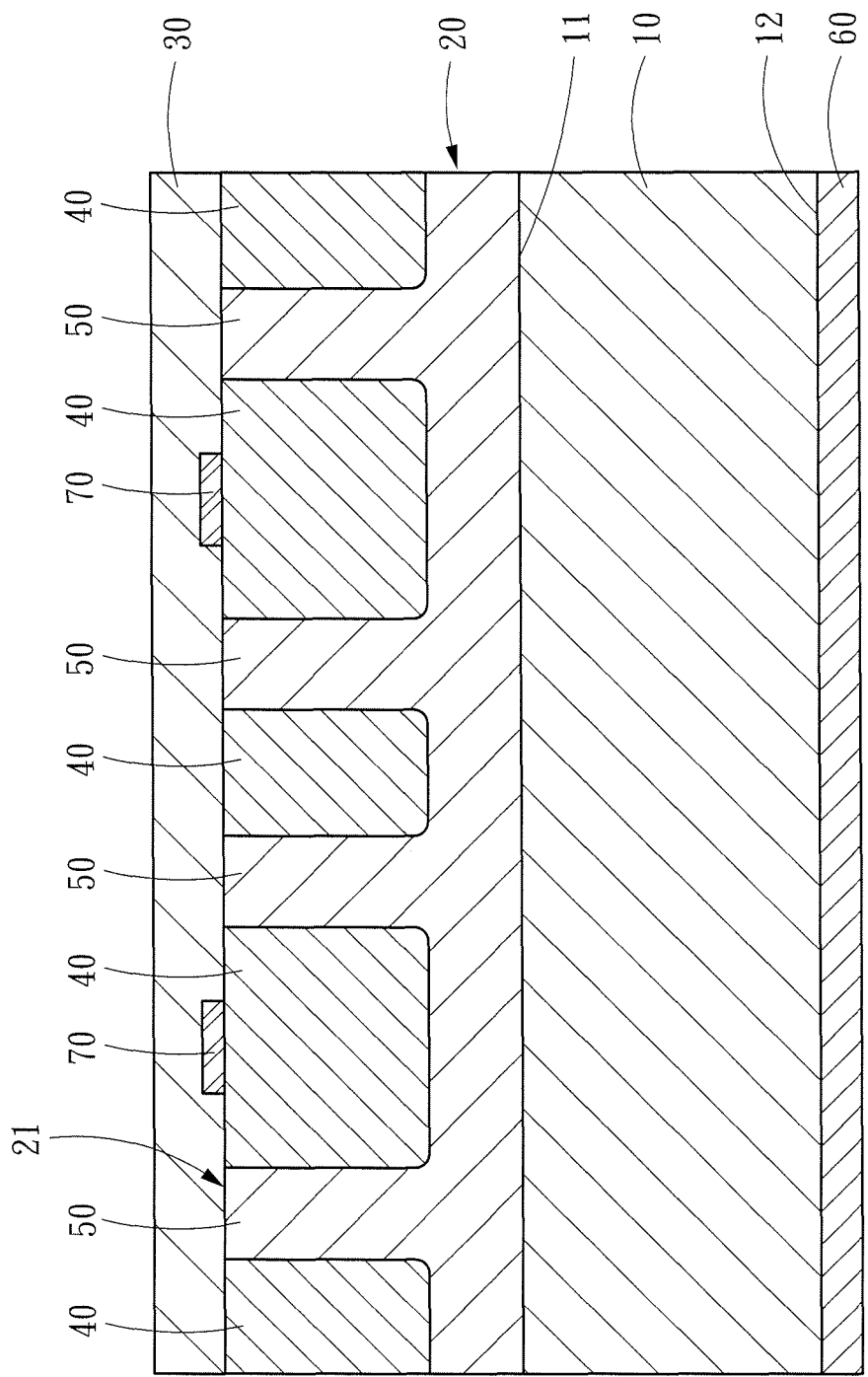

FIG. 6A and FIG. 6B are schematic diagrams of arrangements of a third metal layer according to a second embodiment of the present invention. In the second embodiment, compared to the first embodiment, a plurality of third metal layers 70 are further included. Referring FIG. 6B, the third metal layers 70 are disposed at the third surface 21, and are located between the p-type doping region 40 and the first metal layer 30. An Ohmic contact is formed between the third metal layers 70 and the p-type doping region 40. The third metal layers 70 may be made of a material such as titanium, aluminum, molybdenum, nickel, tantalum, tungsten, gold, silver or silicides of the above elements. Again referring to FIG. 6A, the junction field-effect region 50 further includes a first junction field-effect region 501 and a second junction field-effect region 502 arranged next to the first junction field-effect region 501. The first junction field-effect region 501 has a first inter-circle region 521, and the second junction field-effect region 502 has a second inter-circle region 522 opposite to the first inter-circle region 521. The first inter-circle region 521 and the second inter-circle region 522 face each other. Further, the first inter-circle region 521 and the second inter-circle region 522 have smaller widths, such that the p-type doping region 40 between the first inter-circle region 521 and the second inter-circle region 522 is allowed with a larger area to more easily form the third metal layers 70 thereon. The third metal layers 70 may be located between the first junction field-effect region 501 and the second junction field-effect region 502, e.g., between the first inter-circle region 521 and the second inter-circle region 522, or at a vacant position arranged between the first junction field-effect region 501 and the second junction field-effect region 502.

Figure 7:
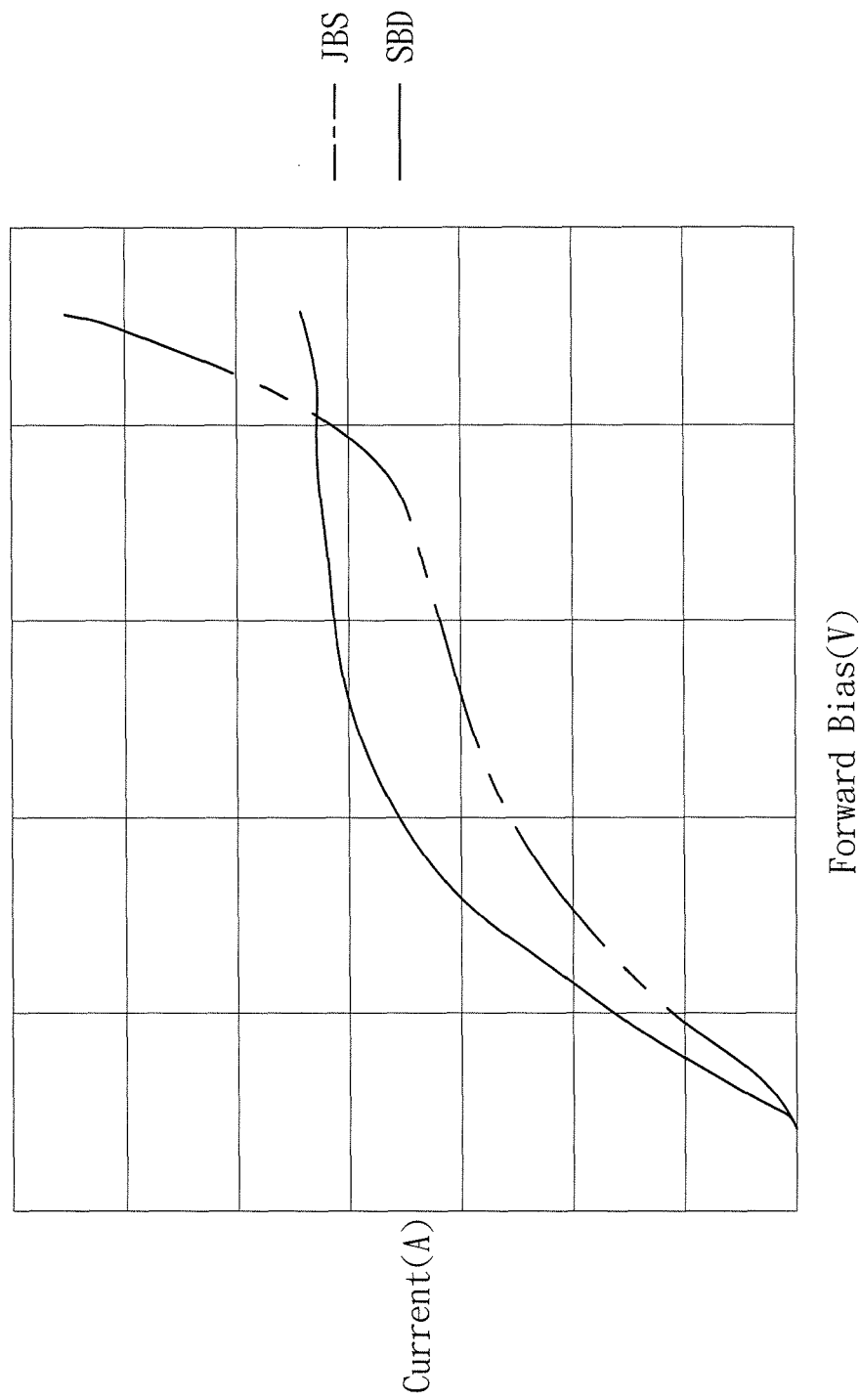
FIG. 7 is schematic diagram of electrical characteristics of the second embodiment of the present invention and a conventional Schottky barrier diode under a forward bias.

FIG. 7 shows a schematic diagram of electrical characteristics of the second embodiment of the present invention and a conventional Schottky barrier diode under a forward bias. Known from FIG. 7, under the above arrangement, the conventional Scottky barrier diode has a greater forward current under a lower forward bias. However, as the forward bias increases, compared to the SiC junction barrier Schotky rectifier of the second embodiment, the forward current of the conventional Schottky barrier diode reaches saturation earlier. Therefore, it is indicated that, through the Ohmic contact formed between the third metal layers 70 and the p-type doping region 40, the SiC junction barrier Schotky rectifier of the second embodiment is capable of withstanding a greater surge current and thus more rugged.

In conclusion, in the present invention, the p-type doping region and the junction field-effect regions are disposed at the n-type drift layer, and the junction field-effect regions are surrounded by the p-type doping region to be spaced from one another. Through geometric characteristics of the circular regions and the inter-circle regions, when the SiC junction barrier Schotky rectifier operates under a reverse bias, the leakage current is effectively reduced to improve the issue of a large leakage current of a conventional Schottky barrier diode. Further, in the present invention, the third metal layers are disposed to form the Ohmic contact to increase the device ruggedness of the SiC junction barrier Schotky rectifier.

What is claimed is:

1. A SiC junction barrier controlled Schottky (JBS) rectifier, comprising:
   a heavily doped n-type SiC substrate, comprising a first surface and a second surface opposite to the first surface;
   an n-type drift layer, disposed at the first surface, comprising a third surface away from the first surface;
   a p-type doping region, disposed in the n-type drift layer, being in contact with the third surface;
   a plurality of junction field-effect regions, disposed in then-type drift layer, surrounded by the p-type doping region, and being in contact with the third surface, each comprising N circular regions and (N−1) inter-circle regions each connecting two of the circular regions, N being a natural number;
   a first metal layer, disposed at the third surface, a Schottky barrier is formed between the first metal layer and the junction field-effects regions;
   a second metal layer, disposed at the second surface, an Ohmic contact is formed between the second metal layer and the SiC substrate; and
   a plurality of third metal layers, disposed at the third surface and arranged between the p-type doping region and the first metal layer, an Ohmic contact is formed between the third metal layers and the p-type doping region.

2. The SiC junction barrier controlled Schottky rectifier of claim 1, wherein each of the inter-circle regions is formed by connecting two of the circular regions by two arcs, and at least one of the two arcs is concave.

3. The SiC junction barrier controlled Schottky rectifier of claim 2, wherein tangent slopes at connecting positions of the arcs and the circular regions are equal.

4. The SiC junction barrier controlled Schottky rectifier of claim 1, wherein a width of the inter-circle region perpendicular to a connecting line between centers of two of the circular regions is smaller than a diameter of the circular regions.

5. The SiC junction barrier controlled Schottky rectifier of claim 1, wherein N is 2.

6. The SiC junction barrier controlled Schottky rectifier of claim 1, wherein a material of the third metal layers is selected from a group consisting of titanium, aluminum, molybdenum, nickel, tantalum, tungsten, and silicides of the above elements.

7. The SiC junction barrier controlled Schottky rectifier of claim 1, wherein a material of the first metal layer is selected from a group consisting of titanium, aluminum, molybdenum, nickel, tantalum, tungsten, and silicides of the above elements.

8. The SiC junction barrier controlled Schottky rectifier of claim 1, wherein a material of the second metal layer is selected from a group consisting of titanium, aluminum, molybdenum, nickel, tantalum, tungsten, gold, silver and silicides of the above elements.

9. The SiC junction barrier controlled Schottky rectifier of claim 1, wherein a ratio of a surface area of the junction field-effects regions to a surface area of the p-type doping region is between 4:6 and 9:1.

10. The SiC junction barrier controlled Schottky rectifier of claim 1, wherein the first metal layer performs as an anode, the second metal layer performs as a cathode, a depletion width (W1) of a depletion region is formed between the p-type doping region and the n-type drift layer when an applied bias between the anode and the cathode is 0 volt, the depletion width (W1) is smaller than a radius of the circular regions.

11. The SiC junction barrier controlled Schottky rectifier of claim 1, wherein the first metal layer performs as an anode, the second metal layer performs as a cathode, a depletion width (W2) of a depletion region is formed between the p-type doping region and the n-type drift layer when an applied bias between the anode and the cathode is half of a rated blocking voltage, and the depletion width (W2) is greater than a radius of the circular regions.

* * * * *